(12) United States Patent
Depta et al.

(10) Patent No.: US 12,071,258 B2
(45) Date of Patent: Aug. 27, 2024

(54) AIRCRAFT BEACON LIGHT, AND AIRCRAFT COMPRISING AN AIRCRAFT BEACON LIGHT

(71) Applicant: Goodrich Lighting Systems GmbH & Co. KG, Lippstadt (DE)

(72) Inventors: Marion Depta, Lippstadt (DE); Andre Hessling von Heimendahl, Koblenz (DE); Carsten Pawliczek, Lippstadt (DE); Björn Schallenberg, Geseke (DE)

(73) Assignee: GOODRICH LIGHTING SYSTEMS GMBH & CO. KG, Lippstadt (DE)

( * ) Notice: Subject to any disclaimer, the term of this patent is extended or adjusted under 35 U.S.C. 154(b) by 0 days.

(21) Appl. No.: 18/408,276

(22) Filed: Jan. 9, 2024

(65) Prior Publication Data

US 2024/0246695 A1    Jul. 25, 2024

(30) Foreign Application Priority Data

Jan. 23, 2023  (EP) .................................... 23152970

(51) Int. Cl.
  *B64D 47/06*   (2006.01)
  *H01L 25/075*  (2006.01)
  *H01L 33/30*   (2010.01)

(52) U.S. Cl.
  CPC .......... *B64D 47/06* (2013.01); *H01L 25/0753* (2013.01); *H01L 33/30* (2013.01); *B64D 2203/00* (2013.01)

(58) Field of Classification Search
  CPC ........................... B64D 2203/00; B64D 47/06
  See application file for complete search history.

(56) References Cited

U.S. PATENT DOCUMENTS

| | | | |
|---|---|---|---|
| 6,507,290 B1 | 1/2003 | Lodhie et al. | |
| 7,645,053 B2 | 1/2010 | Machi et al. | |
| 11,006,500 B1* | 5/2021 | Edquist | F21S 43/40 |
| 11,085,605 B2* | 8/2021 | Iwakura | F21S 41/176 |
| 2006/0007012 A1 | 1/2006 | Machi et al. | |
| 2006/0255710 A1 | 11/2006 | Mueller-Mach et al. | |
| 2009/0010013 A1 | 1/2009 | Hessling | |
| 2010/0027281 A1 | 2/2010 | Waters et al. | |
| 2014/0160774 A1 | 6/2014 | Lapujade | |
| 2017/0284630 A1 | 10/2017 | Sergenese et al. | |
| 2019/0291894 A1* | 9/2019 | Hessling-Von Heimendahl et al. | B64D 47/06 |

(Continued)

OTHER PUBLICATIONS

European Patent Office; European Search Report dated Jul. 24, 2023 in Application No. 23152970.2.

(Continued)

*Primary Examiner* — Eric T Eide
(74) *Attorney, Agent, or Firm* — SNELL & WILMER L.L.P.

(57) ABSTRACT

An aircraft beacon light includes: a plurality of first LEDs, wherein the plurality of first LEDs emit aviation red light in accordance with Federal Aviation Regulations section 25.1397 at an operating temperature of 25° C.; and a plurality of second LEDs, wherein the plurality of second LEDs are phosphor-converted LEDs of red or reddish orange color; wherein the aircraft beacon light is configured to jointly flash the plurality of first LEDs and the plurality of second LEDs for emitting a red beacon light output.

12 Claims, 8 Drawing Sheets

(56) References Cited

U.S. PATENT DOCUMENTS

2019/0382132 A1 12/2019 Jha et al.
2020/0283166 A1* 9/2020 Sure ................ H05B 45/00

OTHER PUBLICATIONS

Singer, J. et al. "Lighting trends and challenges for the aviation market." SPIE Jan. 2006 vol. 6337. doi: 10.1117/12.694802.

* cited by examiner

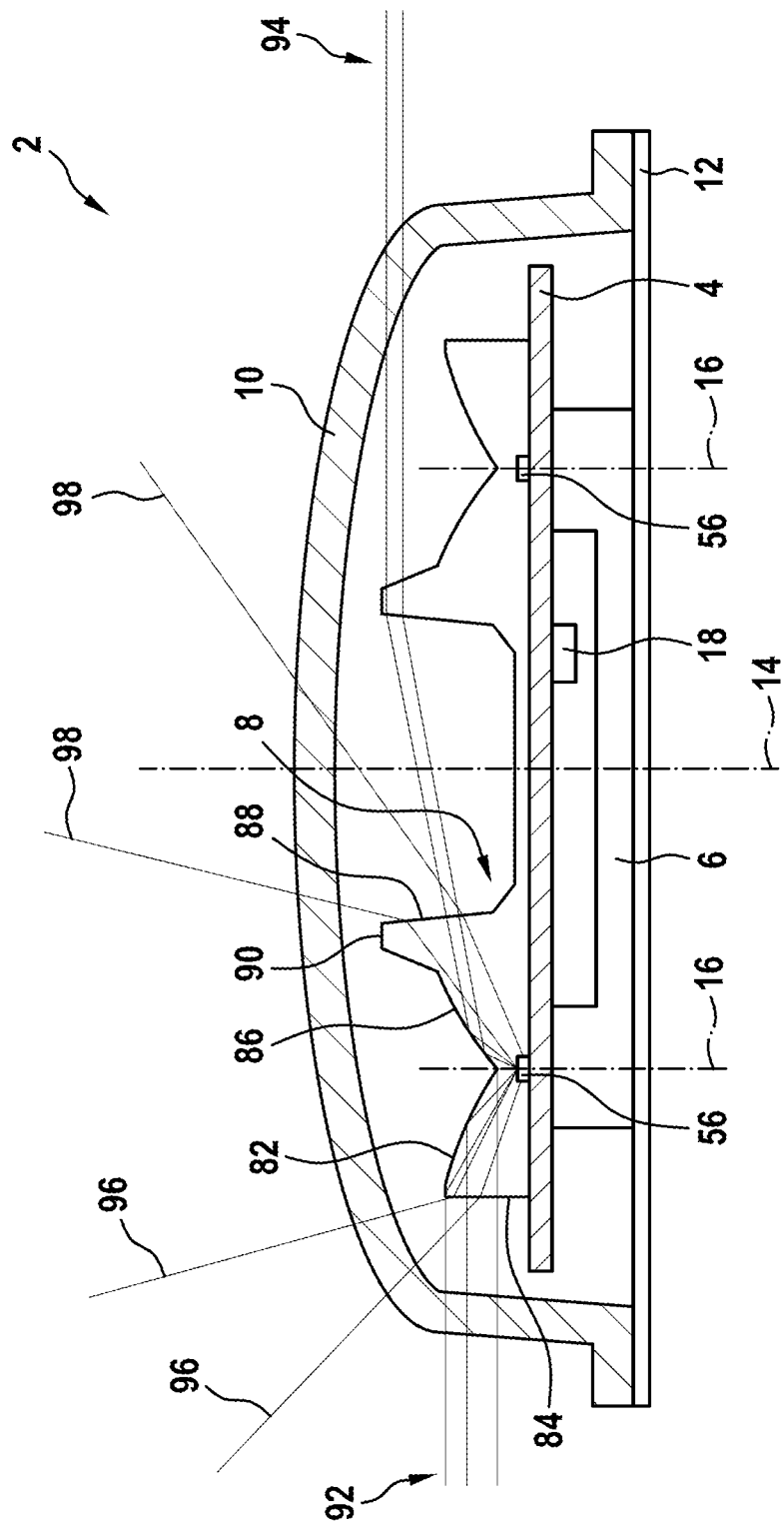

AIRCRAFT BEACON LIGHT, AND AIRCRAFT COMPRISING AN AIRCRAFT BEACON LIGHT

CROSS-REFERENCE TO RELATED APPLICATIONS

This application claims priority to, and the benefit of, EP Patent Application No. 23152970.2, filed Jan. 23, 2023 and titled "AIRCRAFT BEACON LIGHT, AND AIRCRAFT COMPRISING AN AIRCRAFT BEACON LIGHT," which is incorporated by reference herein in its entirety for all purposes.

FIELD

The present invention relates to exterior aircraft lighting. In particular, it relates to an aircraft beacon light and to an aircraft equipped with one or more aircraft beacon lights.

BACKGROUND

Almost all aircraft are equipped with exterior lighting systems. For example, large commercial aircraft have a wide range of different exterior aircraft lights. An exemplary group of exterior aircraft lights are lights for passive visibility, such as navigation lights, white strobe anti-collision lights, and red-flashing beacon lights. Many aircraft have two red-flashing beacon lights, arranged on the top of the aircraft fuselage and on the bottom of the aircraft fuselage, respectively. Their red flashes commonly indicate that the engines of the aircraft are turned on. Another exemplary group of exterior aircraft lights are headlights that allow the pilots to view the area in front of them, when they are seated in the cockpit, such as taxi lights, take-off lights, landing lights, and runway turn-off lights. Yet another example of exterior aircraft lights are scan lights that allow the inspection of the aircraft structure in the dark, such as wing scan lights and engine scan lights.

Many exterior aircraft lights are highly regulated in terms of their light output. In particular, the exterior aircraft lights may be subject to requirements in terms of their light intensity distribution and/or in terms of the emitted light color. For modern exterior aircraft lights, which rely on LED technology for their light sources, it is very difficult to fulfill the light output requirements under all operating conditions and over the lifetime/service life of the exterior aircraft lights. This is because LEDs are subject to and are sensitive to electrical, thermal, and humidity stresses, all of which may be present in exterior aircraft lights. The stresses may lead to instantaneous reductions of the light output, caused by the momentary operating conditions, and to more long-term reductions of the light output, such as due to aging of the LEDs. For red-flashing beacon lights, it has been found particularly difficult to fulfill the requirements in terms of light intensity and light color over a large range of operating conditions and over time. Given these practical limitations, it is sometimes accepted that red-flashing beacon lights do not fulfill all sets of requirements for all operating conditions and all stages of the life cycle. However, there is still a desire to provide red-flashing beacon lights that are in conformity with the requirements to a very large extent.

Accordingly, it would be beneficial to provide an aircraft beacon light with a good trade-off between light intensity compliance and light color compliance over a wide range of operating conditions. It would further be beneficial to provide an aircraft equipped with such aircraft beacon light.

SUMMARY

Exemplary embodiments of the invention include an aircraft beacon light, comprising: a plurality of first LEDs, wherein the plurality of first LEDs emit aviation red light in accordance with Federal Aviation Regulations (FAR) section 25.1397 at an operating temperature of 25° C.; and a plurality of second LEDs, wherein the plurality of second LEDs are phosphor-converted LEDs of red or reddish orange color; wherein the aircraft beacon light is configured to jointly flash the plurality of first LEDs and the plurality of second LEDs for emitting a red beacon light output.

Exemplary embodiments of the invention allow for the provision of an aircraft beacon light that has a particularly good trade-off between compliance with light intensity requirements and compliance with light color requirements over a wide range of operating conditions. By combining a plurality of first LEDs, which emit aviation red light in accordance with FAR section 25.1397 at an operating temperature of 25° C., and a plurality of second LEDs, which are phosphor-converted LEDs of red or reddish orange color, a slight deviation of the overall beacon light output from the FAR requirements for aviation red may be accepted, in order to have an improved light intensity stability over a wide range of operating temperatures. The phosphor-converted LEDs of red or reddish orange color may have a superior temperature stability with respect to their light output intensity, as compared to currently available LEDs that emit aviation red light in accordance with the FAR standard. As compared to previous approaches, where very large numbers of LEDs that emit aviation red light in accordance with the FAR requirements were used, in order to satisfy the FAR requirements at high operating temperatures, the total number of LEDs may be greatly reduced. This in turn may lead to a more compact aircraft beacon light and to improved aerodynamic properties, such as to less aerodynamic drag introduced by a fuselage-mounted aircraft beacon light. As compared to other previous approaches, where a comparably small number of LEDs that emit aviation red light in accordance with the FAR requirements was used and a usage in only a limited temperature range was permitted and/or a comparably severe violation of FAR light intensity requirements at high operating temperatures was accepted, a higher light intensity output may be achieved at high operating temperatures and a closer approximation to the FAR light intensity requirements may be achieved at high operating temperatures. With exemplary embodiments of the invention, a high light intensity at high operating temperatures and a highly compact and efficient design of the aircraft beacon light may be achieved, while deviating only to a comparably small extent from the aviation red color requirements of the Federal Aviation Regulations at high operating temperatures.

The plurality of first LEDs emit aviation red light in accordance with Federal Aviation Regulations section 25.1397 at an operating temperature of 25° C. FAR section 25.1397 specifies that each position light color must have the applicable International Commission on Illumination chromaticity coordinates as follows: (a) aviation red—y is not greater that 0.335; and z is not greater than 0.002. This citation is taken from document number 5066, 29 FR 18291, Dec. 24, 1964, as amended by Amendment 25-27, 36 FR 12972, Jul. 10, 1971. The applicable International Commission on Illumination chromaticity specification on that date was the International Commission on Illumination (CIE) 1931 color space, which is still used as the applicable standard in the aerospace industry at present. As is apparent from the specification of the y and z values, the CIE 1931 XYZ color space is the relevant specification. All references to aviation red light in accordance with the FAR requirements, as given herein, are understood as referring to the provision cited above. With x+y+z=1 according to the CIE 1931 XYZ color space, the color specification for aviation red light of FAR section 25.1397 can also be expressed as y≤0.335 and x≥0.998−y.

The plurality of first LEDs emit aviation red light in accordance with Federal Aviation Regulations section 25.1397 at an operating temperature of 25° C. The operating temperature of the LEDs, as used herein, are the respective junction temperatures of the LEDs. The junction temperatures of the LEDs may be the product of the ambient temperature and the self-heating of the LEDs in operation. The behavior at the operating temperature of 25° C. may for example be tested when observing the light emission of the plurality of first LEDs at an ambient temperature of 25° C. right after start-up of the first LEDs. The light emission may in particular be tested at the beginning/in the early stages of the service life of the aircraft beacon light, i.e. at a point in time before significant aging of the plurality of first LEDs has taken place.

The plurality of first LEDs may be any suitable kind of LEDs that emit aviation red light in accordance with Federal Aviation Regulations section 25.1397 at an operating temperature of 25° C. In particular, the plurality of first LEDs may be LEDs that are not phosphor-converted LEDs. Further in particular, the plurality of first LEDs may be LEDs where the light emitting semiconductor component inherently emits red light.

The plurality of first LEDs may have a light intensity drop of between 50% and 80% between an operating temperature of 25° C. and an operating temperature of 150° C. It is also possible that the temperature-sensitivity of the plurality of first LEDs is expressed in terms of the luminous flux reduction. The plurality of first LEDs may have a luminous flux drop of between 50% and 80% between an operating temperature of 25° C. and an operating temperature of 150° C. The given values reflect common temperature behavior of commercially available LEDs that emit aviation red light in accordance with the Federal Aviation Regulations. In contrast thereto, the phosphor-converted LEDs may have a light intensity drop of less than 40%, in particular of less than 30%, further in particular of less than 25%, between an operating temperature of 25° C. and an operating temperature of 150° C. Again, it is possible that the temperature-sensitivity of the phosphor-converted LEDs is expressed in terms of the luminous flux reduction. The phosphor-converted LEDs may have a luminous flux drop of less than 40%, in particular of less than 30%, further in particular of less than 25%, between an operating temperature of 25° C. and an operating temperature of 150° C. The given values reflect the temperature behavior of commercially available phosphor-converted LEDs of red or reddish orange color. By combining the first LEDs and the second LEDs, the light intensity drop/luminous flux drop may be brought to a value that is between the above discussed values for the first LEDs alone and the second LEDs alone. Accordingly, a higher light intensity stability/luminous flux stability may be achieved with the addition of the second LEDs, as compared to embodiments where only the first LEDs are present.

The plurality of second LEDs are phosphor-converted LEDs of red or reddish orange color. The term phosphor-converted LED is a standard term in the art, and phosphor-converted LEDs are per se known. The term phosphor-converted LED relates to LEDs where the light emitting semiconductor component emits light of a first color, often blue light or violet light, and where a wavelength converting material/substance provides for a wavelength shift of the light emitted by the LED. The light emitted by the LED has a different wavelength/spectrum, as compared to the light emitted by the light emitting semiconductor component of the LED. The wavelength conversion may apply to a portion of the light emitted by the light emitting semiconductor component or to most or substantially all of the light emitted by the light emitting semiconductor component. The second LEDs, as referred to herein, are LEDs where a wavelength conversion towards red/reddish orange light takes place within the LED. The wavelength converting material/substance may be referred to as phosphor in the art. The term phosphor conversion refers to a conversion in color/wavelength by a suitable material/substance, as it is a standard use of the term in the art, and does not mean that the chemical element phosphor must be employed.

The aircraft beacon light is configured to jointly flash the plurality of first LEDs and the plurality of second LEDs for emitting a red beacon light output. In particular, the aircraft beacon light may have a controller that is coupled to the plurality of first LEDs and to the plurality of second LEDs. The controller may be configured to effect a pulsed power supply to the plurality of first LEDs and to the plurality of second LEDs in operation. In this way, the plurality of first LEDs and the plurality of second LEDs may provide for a sequence of red light flashes in operation. The plurality of first LEDs and the plurality of second LEDs may be in perfect synchronization regarding the sequence of light flashes or may have a slight offset. In any case, for the majority of the time durations of the light flashes, the plurality of first LEDs and the plurality of second LEDs may be concurrently in the on-state.

According to a further embodiment, the plurality of second LEDs do not emit aviation red light in accordance with Federal Aviation Regulations section 25.1397 at an operating temperature of 25° ° C.

According to a further embodiment, the plurality of second LEDs do not emit aviation red light in accordance with SAE AS 8017 at an operating temperature of 25° C. The society of automotive engineers (SAE) aerospace standard (AS) is another source of regulations/guidelines for various aircraft parts and operations. In terms of the color specification for exterior aircraft lights, the SAE AS 8017 guidelines are less strict than the definition of aviation red light according to FAR section 25.1397. In particular, SAE AS 8017 recites the definition of aviation red according to FAR section 25.1397 and contains the additional statement that, as an alternate color definition that has been practiced by industry's TSO and certification programs, aviation red has a purple boundary of y=0.980−x and a yellow boundary of y=0.335. Stated differently, SAE AS 8017 requires aviation red light to have y≤0.335 and x≥0.98−y in the CIE 1931 XYZ color space. Red light fulfilling these alternate conditions is herein referred to as aviation red in accordance with SAE AS 8017/aviation red compliant with the SAE 8017 requirements. With the plurality of second LEDs not having to be compliant with FAR section 25.1397 and not having to be compliant with SAE AS 8017, a high degree of design freedom may be provided for selecting the plurality of second LEDs.

According to a further embodiment, the red beacon light output is aviation red in accordance with SAE AS 8017 at an operating temperature of 25° C. of the plurality of first LEDs and the plurality of second LEDs. In other words, the deviation from the aviation red requirement of FAR section 25.1397, as introduced by the plurality of second LEDs, is so small that the red beacon light output of the aircraft beacon light as a whole is still in compliance with the SAE AS 8017 requirement for aviation red. In yet other words, while the aircraft beacon light may exhibit a slight violation of the strict FAR requirement for the light color of the aircraft beacon light, the comparably somewhat less strict requirement of SAE AS 8017 may still be fulfilled. In this way, the aircraft beacon light may still be considered acceptable by regulatory bodies and/or by aircraft manufactures and/or by aircraft operators, i.e. airlines, and/or by air traffic control organizations, including the air traffic controllers at the airports. The resulting aircraft beacon light may be deemed sufficiently in compliance with applicable regulations to be incorporated into new and/or existing aircraft, at least in some application scenarios.

According to a further embodiment, the red beacon light output is aviation red in accordance with SAE AS 8017 at least over an operating temperature range from 25° C. to 150° C. of the plurality of first LEDs and the plurality of second LEDs. In this way, the aircraft beacon light may be SAE-compliant over a wide range of operating conditions. In particular, the aircraft beacon light may be SAE-compliant over a wide range of ambient temperatures and over a wide range of levels of self-heating of the plurality of first LEDs and the plurality of second LEDs.

According to a further embodiment, the red beacon light output is within 1 SCDM of aviation red in accordance with Federal Aviation Regulations section 25.1397 at least over an operating temperature range from 25° C. to 150° C. of the plurality of first LEDs and the plurality of second LEDs. The acronym SCDM stands for Standard Deviation of Color Matching and is an official unit used is LED lighting to indicate light color deviations. Light colors that are within 1 SCDM of each other will appear to most people to be the same. By providing the red beacon light output within 1 SCDM of aviation red in accordance with the Federal Aviation Regulations, a light output that is highly similar to aviation red in accordance with the Federal Aviation Regulations can be provided. Due to the difference to aviation red being non-recognizable for most people, such red beacon light output may be considered acceptable by regulators in various jurisdictions and/or by various aircraft manufactures and/or by various aircraft operators and/or by various air traffic control organizations.

According to a further embodiment, a light intensity drop and/or a luminous flux drop of the red beacon light output from an operating temperature of 25° C. to an operating temperature of 150° C. of the plurality of first LEDs and the plurality of second LEDs is less than 60%, in particular less than 50%, further in particular less than 40%. In this way, as compared to embodiments where only the first LEDs are present, less over-fulfilling of the light intensity requirements at low operating temperatures may be required and/or less of a deviation from the light intensity requirements at higher operating temperatures may have to be accepted.

According to a further embodiment, the plurality of first LEDs are aluminium gallium indium phosphide LEDs. LEDs with AlGaInP-technology are very suitable for providing high-brightness red color emission. While this helps in providing an efficient fulfilling of light intensity requirements at low operating temperatures, such LEDs may suffer from a large light intensity drop at higher operating temperatures. As described herein, such large light intensity drop of the plurality of first LEDs is, at least to some extent, mitigated by the provision of the plurality of second LEDs as phosphor-converted LEDs. A highly beneficial trade-off between the light output behavior of the aircraft beacon light at low operating temperatures and at high operating temperatures may be achieved.

According to a further embodiment, the plurality of second LEDs are of red color, having 0.62<x<0.65 and 0.30<y<0.33 according to the CIE 1931 color space, or of reddish orange color, having 0.61<x<0.64 and 0.34<y<0.37 according to the CIE 1931 color space. LEDs with the given coordinates in the CIE 1931 color space have been found to be particularly suitable as the plurality of second LEDs.

It is also possible that the plurality of second LEDs have other coordinates in the CIE 1931 color space. In particular, it is possible that the plurality of second LEDs have coordinates of x>0.60 and 0.28<y<0.38 in the CIE 1931 color space.

According to a further embodiment, the aircraft beacon light comprises a plurality of mixed LED groups. In particular, the plurality of first LEDs and the plurality of second LEDs may be arranged in mixed LED groups. Further in particular, the light source functionality of the aircraft beacon light may be provided by a plurality of building blocks, with each such building block being a mixed LED group. Providing such mixed LED groups may allow for a closely adjacent arrangement of first LEDs and second LEDs, thus contributing to a color mixing in the immediate vicinity of the aircraft beacon light and contributing to a highly uniform red beacon light output. In particular, a highly uniform red beacon light output in a 360° angle around the aircraft beacon light in the horizontal plane may be provided.

According to a further embodiment, each mixed LED group comprises between three and five of the plurality of first LEDs and between one and two of the plurality of second LEDs. With these numbers of first LEDs and second LEDs per mixed LED group, a particularly good trade-off between the properties of the first LEDs and the properties of the second LEDs may be achieved.

According to a further embodiment, each mixed LED group comprises two first LEDs of reddish orange color, two first LEDs of red color, and one second LED of reddish orange color. In a particular embodiment, the two first LEDs of reddish orange color may emit light with a wavelength of about 615 nm and the two first LEDs of red color may emit light with a wavelength of 620 nm. It is pointed out that these values are exemplary only. Also, it is understood that the border between red and reddish orange may be not perfectly sharp. However, when employing first LEDs of red color and first LEDs of reddish orange color, it can always be said that the LEDs of red color have a longer wavelength than the LEDs of reddish orange color. It has been found that the given combination of first and second LEDs may provide for a good trade-off between providing a red beacon light output close to aviation red in accordance with the Federal Aviation Regulations and providing a comparably high light intensity stability over a wide range of operating temperatures.

According to a further embodiment, each mixed LED group comprises three first LEDs of red color and two second LEDs of reddish orange color. In a particular embodiment, the first LEDs of red color may emit light with a wavelength of about 650 nm. The given combination of first and second LEDs has also been found to provide a particularly good trade-off between providing a red beacon light output close to aviation red in accordance with the Federal Aviation Regulations and providing a comparably high light intensity stability over a wide range of operating temperatures.

According to a further embodiment, the plurality of mixed LED groups are arranged in an annular configuration. In this way, a 360° beacon light output around the aircraft beacon light may be achieved in a particularly efficient manner.

According to a further embodiment, the plurality of mixed LED groups are arranged in a recurring pattern along the annular configuration. In this way, a highly even beacon light output 360° around the aircraft beacon light may be achieved.

According to a further embodiment, the aircraft beacon light further comprises a support, wherein the plurality of first LEDs and the plurality of second LEDs are arranged on the support. The support may in particular be or comprise a circuit board, such as a printed circuit board (PCB).

According to a further embodiment, the aircraft beacon light further comprises an optical structure, arranged over the plurality of first LEDs and the plurality of second LEDs for shaping the red beacon light output from light emitted by the plurality of first LEDs and the plurality second LEDs. The optical structure may comprise one or more optical elements. In particular, the optical structure may comprise one or more lenses and/or one or more reflectors and/or one or more shutters. In a particular embodiment, the optical structure may comprise an annular lens that is arranged over an annular configuration of the plurality of first LEDs and the plurality of second LEDs. The annular lens may in particular be molded over the plurality of first LEDs and the plurality of second LEDs.

According to a further embodiment, the aircraft beacon light further comprises a light transmissive cover. The light transmissive cover may also be referred to as a light transmissive protective cover. The protective cover may protect the inner components of the aircraft beacon light from the demanding environment around an aircraft, such as from exhaust gases, rain and snow, excessive humidity, particle impact, etc. In a particular embodiment, the light transmissive cover is arranged over the support, over the plurality of first LEDs, over the plurality of second LEDs, and over the optical structure. The light transmissive cover may be made from a suitable transparent material, such as PMMA.

According to a further embodiment, the aircraft beacon light is a fuselage-mounted aircraft beacon light. In particular, the aircraft beacon light may be configured for providing a red beacon light output for the upper hemisphere or for the lower hemisphere around the aircraft.

In alternative embodiments, the aircraft beacon light may be a wing-tip-mounted aircraft beacon light or a wing-end-mounted aircraft beacon light. While the wing-tip-mounted aircraft beacon light may be provided in a front edge region of an aircraft wing, the wing-end-mounted aircraft beacon light may be provided at a lateral end of an aircraft wing.

Exemplary embodiments of the invention further include an aircraft, comprising at least one aircraft beacon light as described in any of the embodiments above. The additional features, modifications and effects, as described above with respect to the aircraft beacon light, apply to the aircraft in an analogous manner. The aircraft may be an airplane, such as a large commercial passenger airplane, or a rotorcraft.

According to a further embodiment, the aircraft comprises an upper aircraft beacon light, as described in any of the embodiments above, mounted to an upper portion of a fuselage of the aircraft, and a lower aircraft beacon light, as described in any of the embodiments above, mounted to a lower portion of the fuselage of the aircraft.

BRIEF DESCRIPTION OF THE DRAWINGS

Further exemplary embodiments of the invention will be described below with reference to the accompanying drawings, wherein:

FIG. 8 shows a schematic vertical cross-sectional view of an aircraft beacon light in accordance with an exemplary embodiment of the invention.

DETAILED DESCRIPTION

Figure 1:
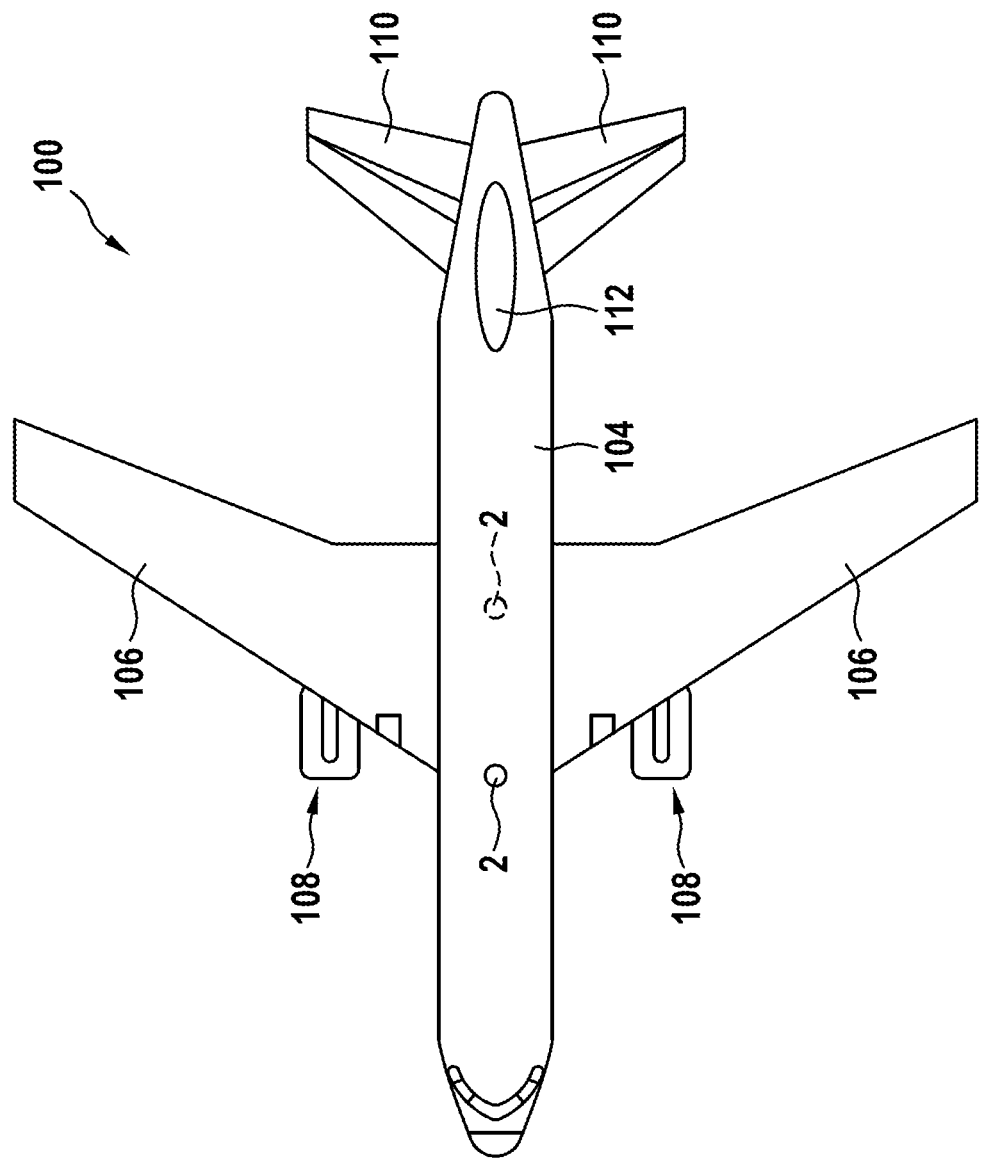
FIG. 1 shows an aircraft in accordance with an exemplary embodiment of the invention, equipped with two aircraft beacon lights in accordance with exemplary embodiments of the invention, in a schematic top view.

FIG. 1 shows an aircraft 100 in accordance with an exemplary embodiment of the invention. The aircraft 100 of FIG. 1 is an airplane, in particular a large commercial passenger or cargo airplane. It is pointed out that other types of aircraft, such as rotorcraft, may also be implemented in accordance with exemplary embodiments of the present invention.

The aircraft 100 has a fuselage 104. Two wings 106 are attached to the right and to the left of the fuselage 104. Each of the wings 106 carries a respective engine 108. Further, two horizontal stabilizers 110 and a vertical stabilizer 112 are mounted to a tail portion of the fuselage 104. Again, it is pointed out that aircraft in accordance with other designs and constructions are encompassed by exemplary embodiments of the present invention.

The aircraft 100 comprises two aircraft beacon lights 2, mounted to the fuselage 104. An upper aircraft beacon light 2 is mounted to a top portion of the fuselage 104 and is depicted with a solid circle in FIG. 1. A lower aircraft beacon light 2 is mounted to a bottom portion of the fuselage 104 and is depicted with a dashed circle in FIG. 1. The upper and lower aircraft beacon lights 2 are in accordance with exemplary embodiments of the invention, exemplary details of which will be described in detail below. In operation, the aircraft beacon lights 2 emit flashes of red light, in order to provide for the beacon light behavior, as expected by other aircraft, ground personnel and air traffic control.

Figure 2:
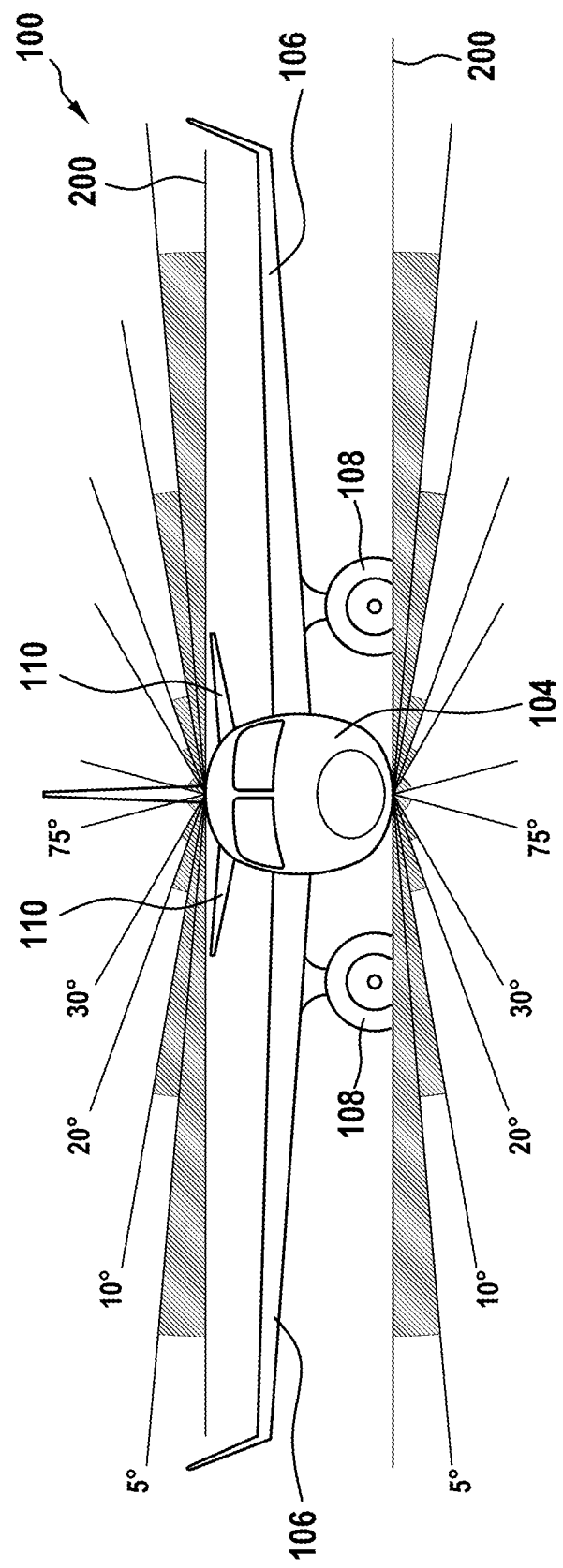
FIG. 2 illustrates the FAR light intensity requirements for aircraft beacon lights in an aircraft frame of reference, with an exemplary aircraft being shown in a front view.

FIG. 2 illustrates a light intensity distribution for an upper aircraft beacon light and a light intensity distribution for a lower aircraft beacon light, as specified by the Federal Aviation Regulations (FAR), when mounted to the top/bottom of an exemplary aircraft 100. In particular, the depicted light intensity distributions reflect the requirements of FAR section 25.1401, applicable to airplanes. The light intensity distributions are shown as angular distributions with respect to respective horizontal planes 200. In particular, the light intensity distributions are shown in a vertical cross-sectional plane that is orthogonal to the longitudinal extension of the aircraft fuselage. As the FAR requirements indicate rotationally symmetric distributions, namely distributions that are identical in all viewing directions from the aircraft beacon light, the shown light intensity distributions would look the same in all vertical cross-sections through the center of the upper aircraft beacon light and through the center of the lower aircraft beacon light.

The depicted light intensity distributions of FIG. 2 are as follows. A minimum light intensity of 400 cd is specified for an angular range of between 0° and 5° with respect to the horizontal plane 200. A minimum light intensity of 240 cd is specified in an angular range of between 5° and 10° with respect to the horizontal plane 200. A minimum light intensity of 80 cd is specified in an angular range of between 10° and 20° with respect to the horizontal plane 200. A minimum light intensity of 40 cd is specified in an angular range of between 20° and 30° with respect to the horizontal plane 200. A minimum light intensity of 20 cd is specified in an angular range of between 30° and 75° with respect to the horizontal plane 200. The light intensity values, shown as angular sectors in FIG. 2, represent minimum light intensity values, as spelled out by FAR section 25.1401. As the horizontal plane 200 is the plane with the highest minimum light intensity, it can also be referred to as the main light output plane. The expressions of the beacon light output fulfilling the FAR requirements or satisfying the FAR requirements or being in accordance with the FAR requirements is to be understood as the beacon light output reaching or exceeding the specified minimum light intensity values, as described above.

While the FAR requirements, as described above, are a standard set of light intensity requirements for aircraft beacon lights, different sets of light intensity requirements exist. For example, the Federal Aviation Regulations section 27.1401 comprise a different set of light intensity requirements for aircraft beacon lights for rotorcraft. Further, other standard setting bodies in the field of aviation and/or individual aircraft manufacturers may establish their own sets of requirements and/or guidelines. For example, Society of Automotive Engineers (SAE) Aerospace Standard (AS) 8017 is another source for a specification of light intensity requirements for aircraft beacon lights. In practice, it is not always possible/mandatory/practical to fulfil the requirements of all standards. For example, in some instances, it may be considered acceptable to fulfil a particular source of requirements. In other instances, it may be considered acceptable to only fulfil particular requirements under certain operating scenarios and/or to only fulfil portions of particular requirements. Still, providing aircraft beacon lights that fulfil the various sources of requirements to an acceptable extent and that have a design which allows for a good integration into the aircraft system and contributes to the design of an efficient aircraft is challenging.

Figure 3:
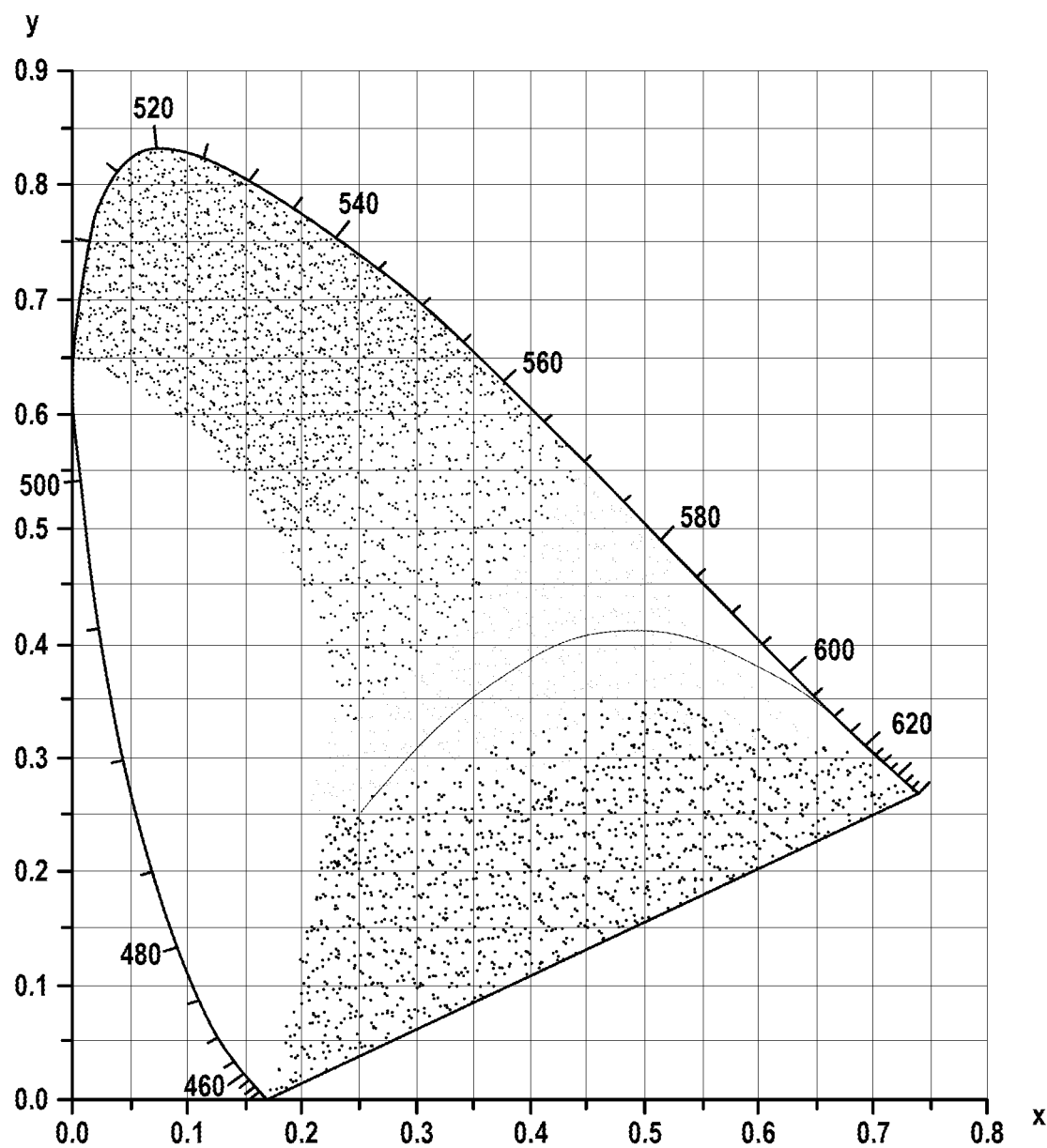
FIG. 3 depicts a schematic representation of the CIE 1931 chromaticity diagram.

FIG. 3 depicts a schematic representation of the CIE 1931 chromaticity diagram, i.e. a schematic representation of the International Commission on Illumination (CIE) 1931 XYZ color space. FIG. 3 is a grey-scale representation of said diagram. While the diagram is per definition in color, the grey-scale representation allows for illustrating various considerations underlying aircraft beacon lights according to exemplary embodiments of the invention. Also, the CIE 1931 chromaticity diagram is readily available to the public, such that the explanations given herein can be easily read in conjunction with a color version of the CIE 1931 chromaticity diagram. A color version of the CIE 1931 chromaticity diagram is incorporated herein by reference. FIG. 3 is provided as a larger context for the aviation red color considerations, laid out below with respect to FIG. 4. Said FIG. 4 is an enlarged version of a lower right portion of the CIE 1931 chromaticity diagram of FIG. 3.

Figure 4:
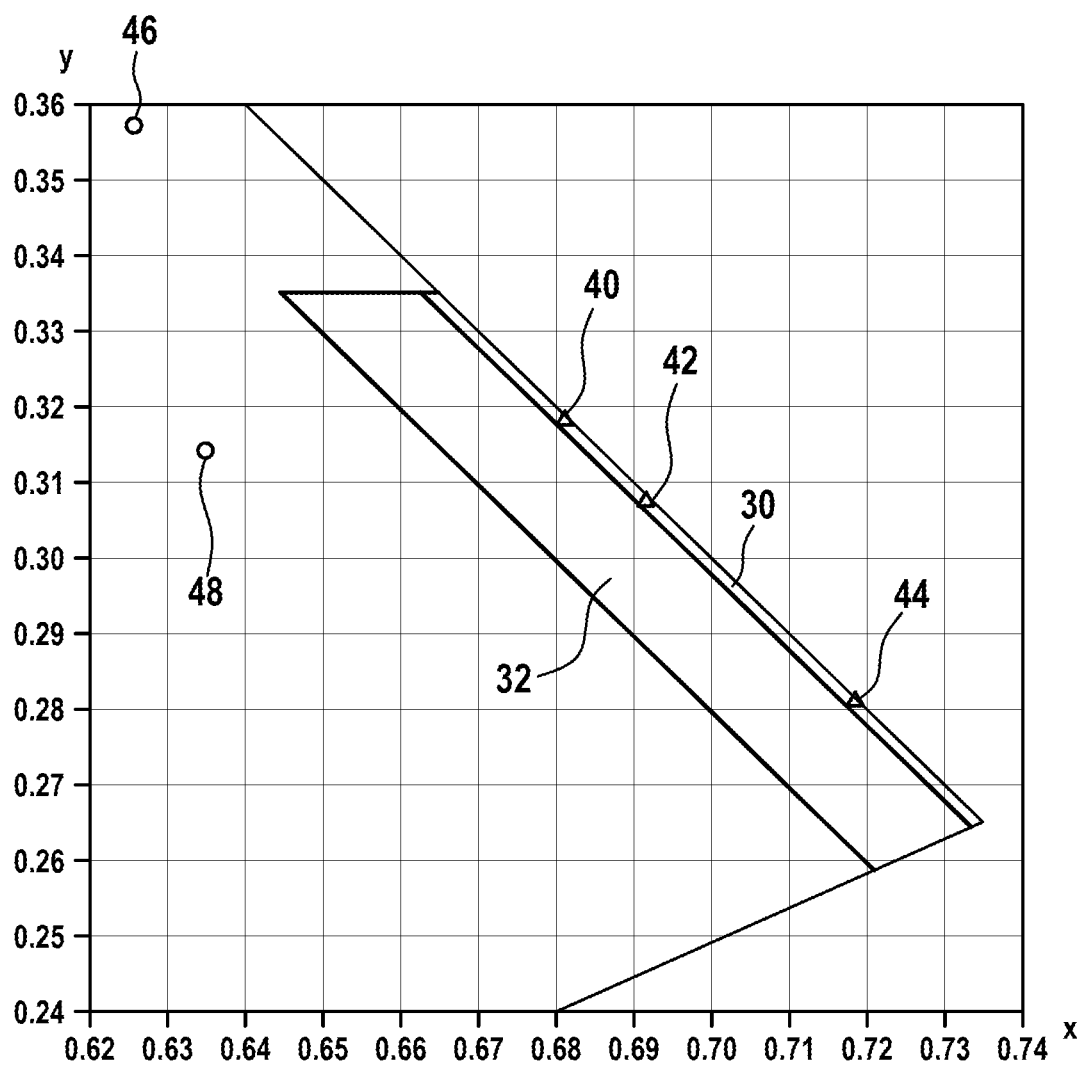
FIG. 4 illustrates different definitions of aviation red in the CIE 1931 chromaticity diagram and indicates the coordinates of different red and reddish orange light sources, as may be used in aircraft beacon lights in accordance with exemplary embodiments of the invention.

FIG. 4 illustrates different definitions of aviation red in the CIE 1931 chromaticity diagram and indicates the coordinates of different red and reddish orange light sources, as may be used in aircraft beacon lights in accordance with exemplary embodiments of the invention.

FIG. 4 indicates a first polygon 30, which represents the definition of aviation red light, as given by the Federal Aviation Regulations (FAR) section 25.1397. According to this specification, aviation red is the set of all colors that are within the CIE 1931 XYZ color space and that have y≤0.335 and x≥0.998−y. Aviation red in accordance with FAR section 25.1397 is a very narrow strip along the outer border of the CIE 1931 XYZ color space, as is illustrated in FIG. 4.

FIG. 4 further indicates a second polygon 32, which represents the definition of aviation red light, as given by the alternate definition of the Society of Automotive Engineers (SAE) Aerospace Standard (AS) 8017, as discussed above. This specification includes all colors that are within the CIE 1931 XYZ color space and that have y≤0.335 and x≥0.98−y. Aviation red according to SAE AS 8017 is a broader strip along the outer border of the CIE 1931 XYZ color space, as illustrated in FIG. 4. In consequence, SAE AS 8017 provides for a broader definition of which colors are considered aviation red than FAR section 25.1397.

FIG. 4 indicates the coordinates of three types of LEDs that emit aviation red light in accordance with FAR section 25.1397 and that may be used in aircraft beacon lights in accordance with exemplary embodiments of the invention. Such LEDs are also referred to as FAR-compliant LEDs or as first LEDs herein. The coordinates of a first type of FAR-compliant LEDs are indicated with reference numeral 40. This first kind of FAR-compliant LEDs is referred to as having reddish orange color herein and emits light of a wavelength of about 615 nm in operation. The coordinates of a second type of FAR-compliant LEDs are indicated with reference numeral 42. This second kind of FAR-compliant LEDs is referred to as LEDs of red color herein and emits light of a wavelength of about 620 nm in operation. The coordinates of a third kind of FAR-compliant LEDs are indicated with reference numeral 44. This third kind of FAR-compliant LEDs is herein referred to as red LEDs or deep red LEDs and emits light of a wavelength of about 650 nm in operation. The first, second and third kinds of FAR-compliant LEDs are for example commercially available under the trade names XLamp® Element G (XE-G) RDO, XE-G RED, and XE-G Photo RED.

FIG. 4 further indicates coordinates of two kinds of phosphor-converted LEDs, as may be used in aircraft beacon lights in accordance with exemplary embodiments of the invention. Phosphor-converted LEDs of red or reddish orange color may also be referred to as second LEDs herein. The coordinates of a first type of phosphor-converted LEDs are indicated with reference numeral 46. The first type of phosphor-converted LEDs is referred to as reddish orange phosphor-converted LEDs herein. The coordinates of a second type of phosphor-converted LEDs are indicated with reference numeral 48. The second type of phosphor-converted LEDs is referred to as red phosphor-converted LEDs herein. The first and second types of phosphor-converted LEDs have coordinates in the CIE 1931 XYZ color space that are outside of the FAR definition of aviation red and outside of the SAE AS definition of aviation red. In particular, the first kind of phosphor-converted LEDs have approximate coordinates of x=0.626 and y=0.358. The second type of phosphor-converted LEDs have approximate coordinates of x=0.635 and y=0.315. The first and second kinds of phosphor-converted LEDs are for example commercially available under the trade names XLamp® Element G (XE-G) phosphor-converted (PC) RDO and XE-G PC RED.

By combining FAR-compliant LEDs, as illustrated with reference numerals 40, 42, 44, and phosphor-converted LEDs, as illustrated with reference numerals 46, 48, a red beacon light output may be achieved that is within the SAE AS definition of aviation red, which is indicated with reference numeral 32. The red beacon light output may thus have a close proximity to FAR aviation red, which is indicated with reference numeral 30, and a comparably good light intensity stability/luminous flux stability over different operating temperatures. This is due to the fact that the phosphor-converted LEDs, as indicated with reference numerals 46, 48, have a smaller light intensity drop/luminous flux drop with an increasing operating temperature than the FAR-compliant LEDs, as indicated with reference numerals 40, 42, 44. This will be discussed in more detail below with reference to FIG. 7.

When combining different types of LEDs, the resulting color of the light output may be determined with the help of the CIE 1931 chromaticity diagram as follows. When assuming a combination of two LEDs of the first type of FAR-compliant LEDs, as indicated with reference numeral 40, and one LED of the second type of phosphor-converted LEDs, indicated with reference numeral 48, the resulting color would be on the connection line between the coordinates 40 and coordinates 48, as illustrated in FIG. 4. When further assuming that all of the three LEDs have similar or the same light intensities, the resulting color would be at ⅔ of the way from the coordinates 48 to the coordinates 40. The factor of ⅔ would be adapted for different relative light intensities. The color mixing between other combinations of LEDs may be determined/illustrated in an analogous manner.

Figure 5B:
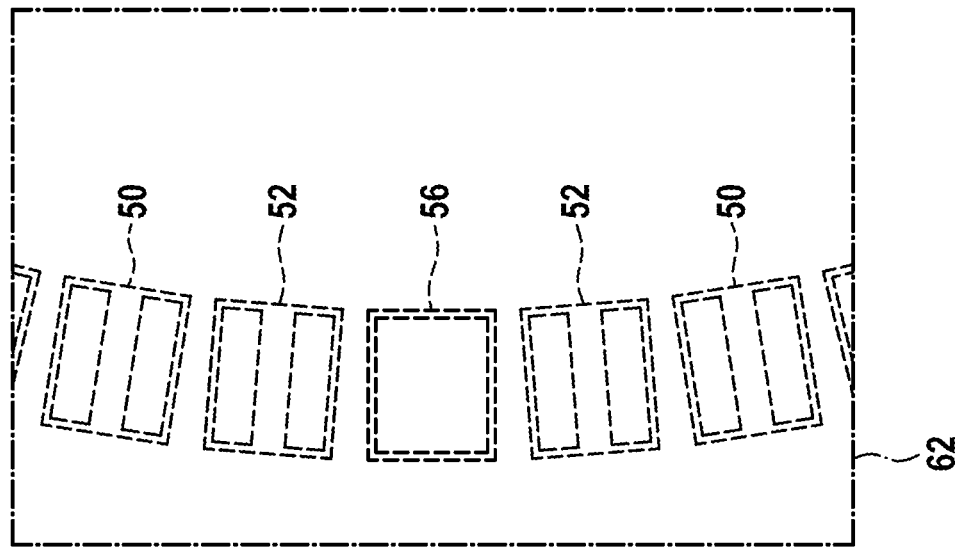
FIGS. 5A and 5B show selected components of an aircraft beacon light in accordance with a first exemplary embodiment of the invention, with FIG. 5A depicting a full top view and FIG. 5B depicting an enlarged cut-out section of FIG. 5A.
Figure 5A:
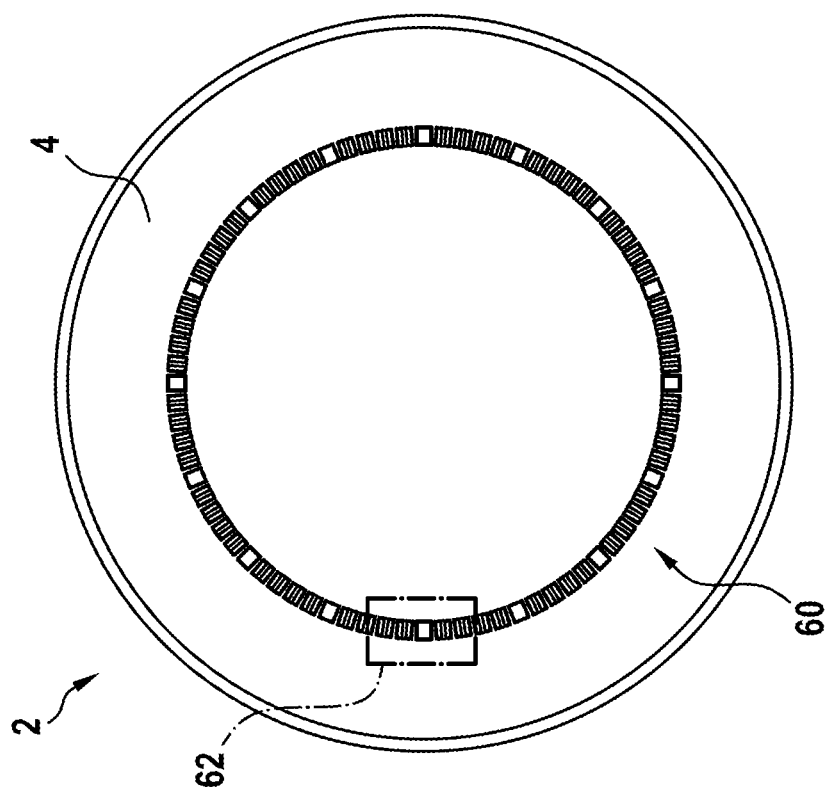

FIG. 5 shows selected components of an aircraft beacon light 2 in accordance with a first exemplary embodiment of the invention, with FIG. 5A depicting a top view of the selected components and FIG. 5B depicting an enlarged view of some of the LEDs of the aircraft beacon light 2.

The aircraft beacon light 2 according to the exemplary embodiment of FIG. 5 comprises a support 4 and an annular arrangement 60 of a plurality of first LEDs and a plurality of second LEDs. In the exemplary embodiment of FIG. 5, the support 4 is a disc-shaped support and may be embodied as a circuit board, in particular as a printed circuit board (PCB). The annular configuration 60 of a plurality of first LEDs and a plurality of second LEDs is arranged on the support 4.

The annular configuration 60 of LEDs comprises sixteen mixed LED groups, one of which is indicated with reference numeral 62 in FIG. 5A and is depicted in an enlarged top view in FIG. 5B. The sixteen mixed LED groups are arranged along the circular outline of the annular arrangement 60 of LEDs. In particular, a repetitive pattern of different kinds of LEDs is provided along the annular arrangement 60 of LEDs. Accordingly, the mixed LED group 62 is described as a sample/as an example of the sixteen mixed LED groups.

The mixed LED group 62 comprises four first LEDs 50, 52 and one second LED 56. The term first LEDs is used to denote LEDs that emit aviation red light in accordance with FAR section 25.1397, as described above. The term second LEDs refers to phosphor-converted LEDs of red or reddish orange color, as described above. In the exemplary embodiment of FIG. 5, the first LEDs 50, 52 are not phosphor-converted LEDs. Rather, they are aluminium gallium indium phosphide (AlGaInP) LEDs. The second LED 56 does not emit aviation red light in accordance with FAR section 25.1397.

The four first LEDs 50, 52 are comprised of two different types of FAR-compliant LEDs. In particular, the first LEDs of the mixed LED group 62 comprise two LEDs 50 of a first type of FAR-compliant LEDs, with the first type of FAR-compliant LEDs having a light emission color as indicated with reference numeral 40 in FIG. 4. The first LEDs of the mixed LED group 62 further comprise two LEDs 52 of a second type of FAR-compliant LEDs, with the second type of FAR-compliant LEDs having a light emission color as indicated with reference numeral 42 in FIG. 4. The second LED 56 is a phosphor-converted LED that has a light emission color as indicated with reference numeral 46 in FIG. 4.

In the mixed LED group 62, the second LED 56 is provided at the center, the two LEDs 52 of the second type of FAR-compliant LEDs are arranged adjacent to the second LED 56 on opposite sides thereof, and the two LEDs 50 of the first type of FAR-compliant LEDs are arranged adjacent to the two LEDs 52 of the second type of FAR-compliant LEDs. In this way, a symmetric arrangement of the five LEDs of the mixed LED group 62 is provided with respect to the second LED 56. It is pointed out that other recurring patterns of first and second LEDs are possible as well. Details regarding the light output behavior of the particular combination of first and second LEDs of the aircraft beacon light 2 of FIG. 5 will be described below with respect to FIG. 7.

Figure 6B:
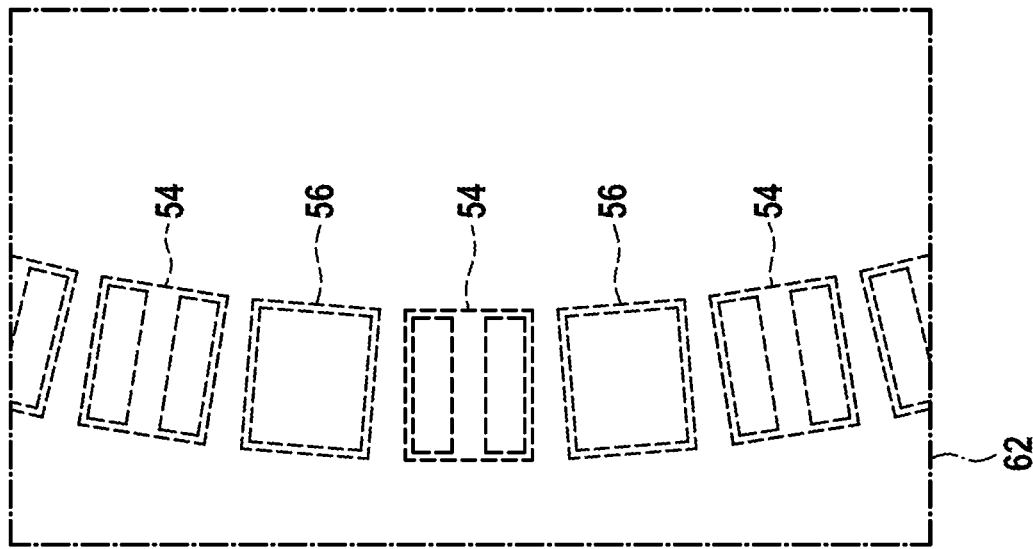
FIGS. 6A and 6B show selected components of an aircraft beacon light in accordance with a second exemplary embodiment of the invention, with FIG. 6A depicting a full top view and FIG. 6B depicting an enlarged cut-out section of FIG. 6A.
Figure 6A:
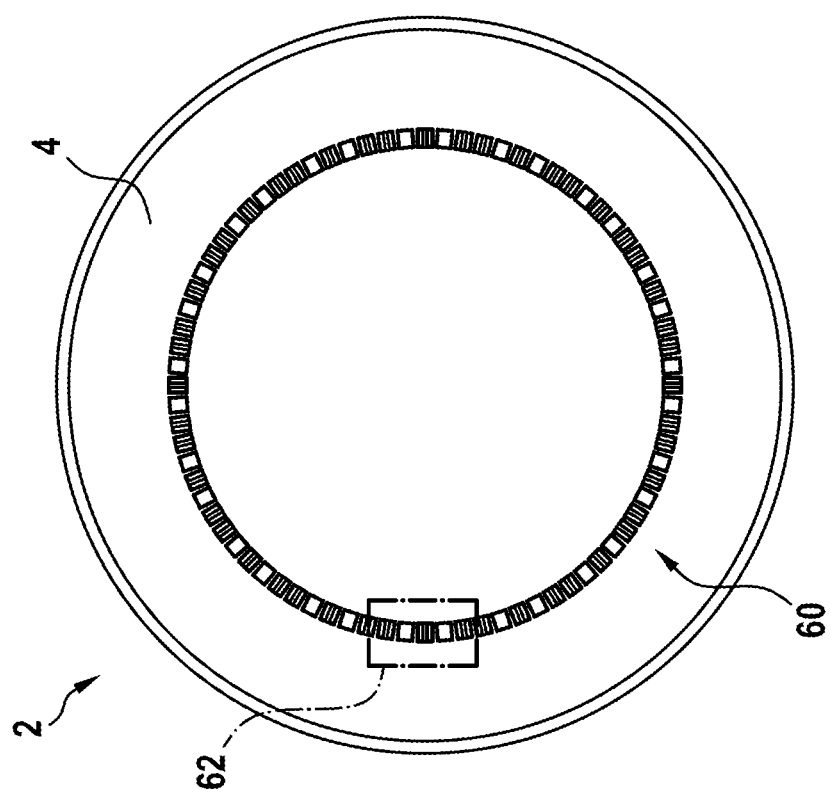

FIG. 6 shows selected components of an aircraft beacon light 2 in accordance with a second exemplary embodiment of the invention, with FIG. 6A depicting a top view of the selected components and FIG. 6B depicting an enlarged version of some of the LEDs of the aircraft beacon light 2. The aircraft beacon light 2 of FIG. 6 is similar to the aircraft beacon light 2 of FIG. 5, with like or similar components being indicated with the same reference numerals. For these components, reference is made to the description of FIG. 5 above.

In particular, the aircraft beacon light 2 of FIG. 6 also comprises sixteen mixed LED groups, an exemplary one of which being indicated with reference numeral 62. As compared to the aircraft beacon light 2 of FIG. 5, the mixed LED group has a different set-up. In particular, the mixed LED group 62 of the aircraft beacon light 2 of FIG. 6 has three first LEDs 54 and two second LEDs 56. The three first LEDs 54 are of a third type of FAR-compliant LEDs, with the light emission color thereof being indicated with reference numeral 44 in FIG. 4. The two second LEDs 56 are phosphor-converted LEDs that have a light emission color as indicated with reference numeral 46 in FIG. 4.

In the exemplary embodiment of FIG. 6, the mixed LED group 62 has a first LED 54 at its center, has two second LEDs 56 arranged adjacent to said first LED 54 at opposite sides thereof, and has two further first LEDs 54 arranged adjacent to the two second LEDs 56. This pattern of five LEDs per mixed LED group 62 is repeated along the annular configuration 60 of first and second LEDs. Again, it is pointed out that the first and second LEDs 54, 56 may be arranged in a different pattern.

Both the aircraft beacon light 2 of FIG. 5 and the aircraft beacon light 2 of FIG. 6 have a resulting beacon light output that is aviation red in accordance with SAE AS 8017. In particular, when keeping above described principles of color mixing in mind, it can be appreciated from the diagram of FIG. 4 that both the combination of four first LEDs 50, 52 and a second LED 56, as described with respect to FIG. 5, as well as the combination of three first LEDs 54 and two second LEDs 56, as described above with respect to FIG. 6, result in a red beacon light output that is not within the first polygon 30 of FAR-compliant colors for aviation red, but within the second polygon 32 of SAE AS compliant colors for aviation red. With the colors of the different types of first LEDs and the colors of the different types of second LEDs, as indicated in FIG. 4, being the light emission colors at an operating temperature of 25° C., the light mixing and the compliance with SAE AS at 25° C. can be appreciated from FIG. 4. It is pointed out that the implementations of FIG. 5 and FIG. 6 provide for a red beacon light output that is SAE AS compliant for a large temperature range. The light output behavior of the aircraft beacon lights 2 of FIG. 5 and FIG. 6 under different operating temperatures will be described as follows.

Figure 7:
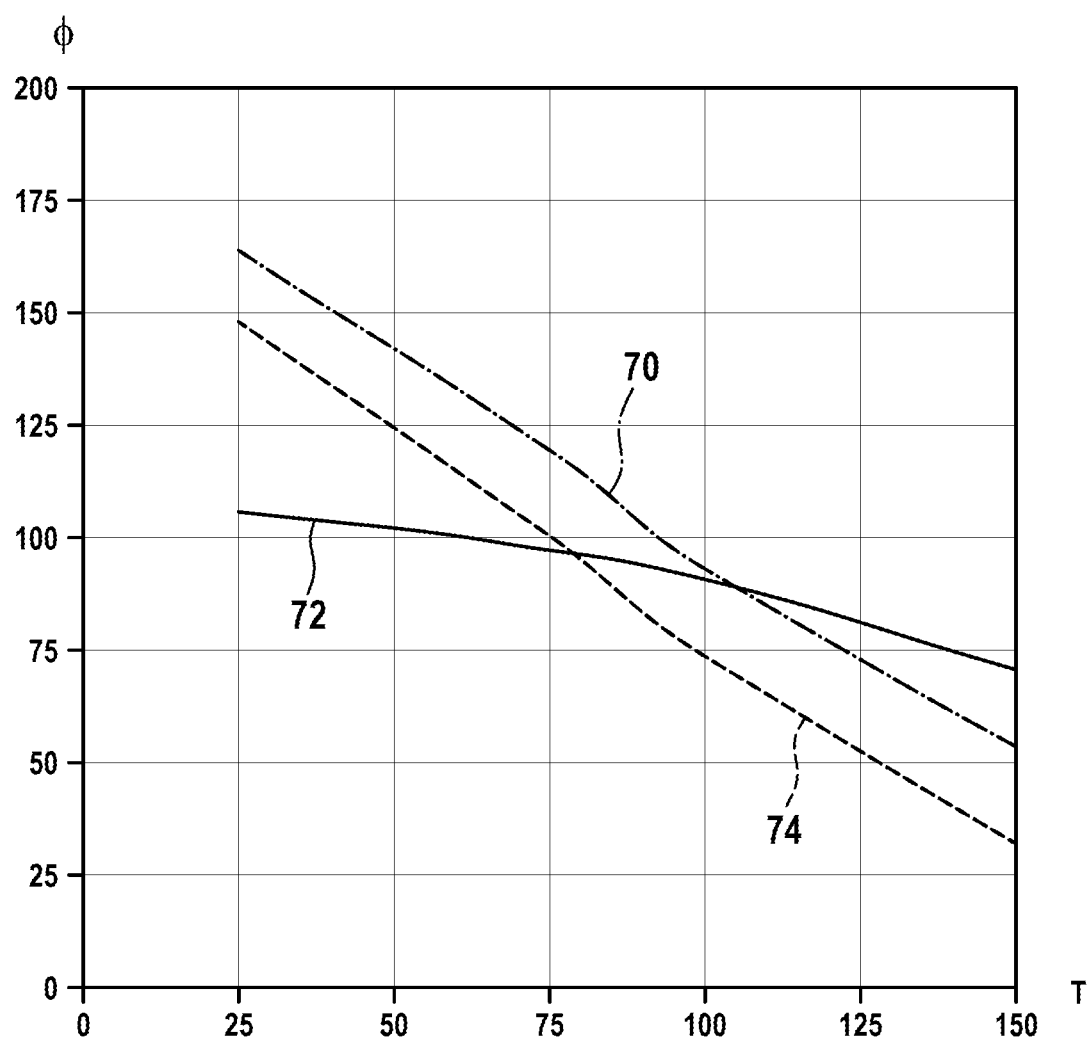
FIG. 7 depicts a diagram illustrating a light output behavior of the aircraft beacon light of FIG. 5, of the aircraft beacon light of FIG. 6, and of an aircraft beacon light in accordance with a comparative example over different operating temperatures.

FIG. 7 depicts a diagram illustrating a light output behavior of the aircraft beacon light 2 of FIG. 5, of the aircraft beacon light 2 of FIG. 6, and of a comparative example of an aircraft beacon light as a function of the operating temperature. A curve of the luminous flux Φ of the aircraft beacon light 2 of FIG. 5 vs. the operating temperature is indicated with reference numeral 70. A curve of the luminous flux Φ of the aircraft beacon light 2 of FIG. 6 vs. the operating temperature is indicated with reference numeral 72. A curve of the luminous flux Φ of a comparative example of an aircraft beacon light, which is not in accordance with an exemplary embodiment of the invention, vs. the operating temperature is indicated with reference numeral 74. The operating temperature T of the aircraft beacon light is indicated on the x-axis of the diagram of FIG. 7, and the luminous flux values of the respective aircraft beacon lights at some sample operating temperatures is indicated on the y-axis of the diagram of FIG. 7. The operating temperature T is the junction temperature of the LEDs of the respective aircraft beacon light in the exemplary diagram of FIG. 7. It is pointed out that similar or even identical curves could be drawn for the light output intensity of the aircraft beacon lights, only with other units and absolute values. This is because the luminous flux Φ is the integral over the light intensity of the aircraft beacon light over a particular solid angle, such as over a full solid angle around the aircraft beacon light.

The temperature-dependent curve 70 of the aircraft beacon light 2 of FIG. 5 is the result of the following LED performance data. The first LEDs 50 of the first type of FAR-compliant LEDs have a drop in luminous flux of about 32% at 75° C., a drop in luminous flux of about 52% at 100° C., and a drop in luminous flux of about 79% at 150° C., as compared to the luminous flux at 25° C. The first LEDs 52 of the second type of FAR-compliant LEDs have a drop in luminous flux of about 32% at 75° C., a drop in luminous flux of about 50% at 100° C., and a drop in luminous flux of about 78% at 150° C., as compared to the luminous flux at 25° C. The second LED 56 of the first type of phosphor-converted LEDs has a drop in luminous flux of about 7% at 75° C., a drop in luminous flux of about 11% at 100° C., and a drop in luminous flux of about 22% at 150° C., as compared to the luminous flux at 25° C.

The temperature-dependent curve 72 of the aircraft beacon light 2 of FIG. 6 is the result of the following LED performance data. The first LEDs 54 of the third kind of FAR-compliant LEDs have a drop in luminous flux of about 10% at 75° C., a drop in luminous flux of about 20% at 100° ° C., and a drop in luminous flux of about 50% at 150° C., as compared to the luminous flux at 25° C. The second LEDs 56 of the first type of phosphor-converted LEDs have a drop in luminous flux of about 7% at 75° ° C., a drop in luminous flux of about 11% at 100° C., and a drop in luminous flux of about 22% at 150° ° C., as compared to the luminous flux at 25° C.

The temperature-dependent curve 74 of a comparative example of an aircraft beacon light is based on the assumption that the comparative example only has first LEDs of the second type of FAR-compliant LEDs, as indicated with reference numeral 42 in FIG. 4. As laid out above, the first LEDs of the second type of FAR-compliant LEDs have a drop in luminous flux of about 32% at 75° C., a drop in luminous flux of about 50% at 100° C., and a drop in luminous flux of about 78% at 150° C., as compared to the luminous flux at 25° C.

As a result of these considerations, the red beacon light output of the aircraft beacon light 2 of FIG. 5 has a drop in luminous flux of about 67% from an operating temperature of 25° ° C. to an operating temperature of 150° C., the red beacon light output of the aircraft beacon light 2 of FIG. 6 has a drop in luminous flux of about 34% from an operating temperature of 25° ° C. to an operating temperature of 150° C., and the red beacon light output of the aircraft beacon light according to the comparative example has a drop in luminous flux of about 78%. As can be appreciated from these numbers, providing above discussed combinations of first LEDs and second LEDs has a highly positive effect on providing more temperature stability in the light output of the aircraft beacon light. While providing such improved behavior over a wide range of operating temperatures, the resulting beacon light output is aviation red in accordance with SAE AS 8017 over the full range of operating temperatures from 25° ° C. to 150° C. This SAE AS 8017 compliance may be achieved, although the particular shade of aviation red light, as output at different operating temperatures, may vary due to the different drops in luminous flux for the different types of LEDs.

FIG. 8 shows a schematic vertical cross-sectional view of an aircraft beacon light 2 in accordance with an exemplary embodiment of the invention. In the exemplary embodiment of FIG. 8, the aircraft beacon light 2 is a fuselage-mounted aircraft beacon light. The aircraft beacon light 2 may for example be employed as an upper aircraft beacon light and/or as a lower aircraft beacon light, as for example depicted in FIG. 1.

The aircraft beacon light 2 of FIG. 8 has a mounting portion 12, which is configured for mounting the aircraft beacon light 2 to the aircraft 100, in particular to the fuselage 104 of the aircraft 100, as it is depicted in FIG. 1.

The aircraft beacon light 2 further comprises a disk-shaped support 4. The support 4 has a central portion. An annular configuration of a plurality of first LEDs and a plurality of second LEDs, as for example depicted in FIG. 5 and FIG. 6, is arranged on the support 4 around the central portion of the support 4. In the exemplary cross-sectional plane of FIG. 8, two second LEDs 56 are depicted.

The support 4 is in turn supported by a support structure 6, which is arranged between the mounting portion 12 and the support 4. The mounting portion 12 may be formed integrally with the support structure 6. The support structure 6 provides mechanical support to the support 4. It may further provide a cooling structure and a cooling space for transferring heat, which is generated by the first and second LEDs, away from the first and second LEDs.

The vertical cross-sectional view of FIG. 8 is a longitudinal cross-sectional view through the aircraft beacon light 2. The cross-sectional view of FIG. 8 may in particular be taken along the longitudinal axis of the fuselage of the aircraft, when the aircraft beacon light 2 is mounted to the fuselage. In other words, the cross-sectional view of FIG. 8 may be a longitudinal cross-sectional view in the aircraft frame of reference. With the aircraft beacon light 2 being a rotationally symmetric device with respect to many of its components, the depicted cross-sectional view could also be another vertical cross-sectional view through the aircraft beacon light 2.

The aircraft beacon light 2 further comprises a lens structure 8. The lens structure 8 is arranged and configured for forming a beacon light output from the light emitted by the plurality of first and second LEDs. In the exemplary embodiment of FIG. 8, the lens structure 8 is a unitary, rotationally symmetric component, which is arranged within the aircraft beacon light 2 for conditioning the light output of the aircraft beacon light 2. The lens structure 8 is arranged over the plurality of first and second LEDs. The lens structure 8 may be made from silicone or from PMMA or from another suitable material, and it may be molded over the plurality of first and second LEDs onto the support 4. In other words, during manufacture, the material of the lens structure 8 may be brought into its eventual shape in a molding process right over the plurality of first and second LEDs and the support 4. It is also possible that the lens structure 8 is molded as a separate element, which is later attached to the support 4, enclosing the plurality of first and second LEDs between the support 4 and the lens structure 8.

The lens structure 8 is a rotationally symmetric component and has various annular optical surfaces, which will be described in detail below. The cross-sectional view of FIG. 8 shows two mirror-symmetrical portions of the lens structure 8 towards the left and towards the right of the central portion of the support 4. It is understood that the individual surfaces and portions of the lens structure 8, which will be described below, extend around the central portion of the support 4 in a revolving manner. It is further understood that the lens structure 8 may or may not be continuous through the central portion of the support 4 and may thus cover a large portion of the support 4.

The lens structure 8 has a light entry surface, which is the boundary surface with respect to the plurality of first and second LEDs, a first total internal reflection surface 82, which is distal from the support 4 and positioned laterally outwards of the plurality of first and second LEDs, a second total internal reflection surface 86, which is distal from the support 4 and positioned laterally inwards of the plurality of first and second LEDs, a first light exit surface 84, which is substantially orthogonal to the support 4 and forms the laterally outermost part of the lens structure 8, and a second light exit surface 88, which is close to orthogonal with respect to the support 4 and which is positioned between the plurality of first and second LEDs and the central portion of the support 4, i.e. laterally inwards of the plurality of first and second LEDs and the second total internal reflection surface 86.

In addition, the lens structure 8 of the exemplary embodiment of FIG. 8 comprises a refractive portion 90, which forms the most distal part of the lens structure 8 with respect to the support 4 and which is arranged between the second light exit surface 88 and the second total internal reflection surface 86, when considering the distance from the axis of symmetry 14.

The aircraft beacon light 2 further comprises a light transmissive cover 10. The light transmissive cover 10 is mounted to the mounting portion 12 and forms an inner space between the mounting portion 12 and the light transmissive cover 10. The support 4, the plurality of first and second LEDs, and the lens structure 8 are arranged in said inner space. The light transmissive cover 10 protects the lens structure 8, the plurality of first and second LEDs, and the support 4 during flight of the aircraft and on the ground. In the exemplary embodiment of FIG. 8, the light transmissive cover 10 is bowl-shaped/cup-shaped and encloses the support 4, the plurality of first and second LEDs, and the lens structure 8.

The light transmissive cover 10 may be made from a transparent, color-less material, such as PMMA. The light transmissive cover 10 may also be made from another suitable material.

The aircraft beacon light 2 further comprises a controller 18. In the exemplary embodiment of FIG. 8, the controller 18 is arranged on the support 4, in particular arranged on a back side of the support 4. The controller 18 may also be provided in or at the support structure 6. The controller 18 may also be provided in other locations in the aircraft beacon light 2.

The controller 18 is coupled to the plurality of first LEDs and the plurality of second LEDs. The controller 18 is configured to effect a pulsed power supply to the plurality of first LEDs and the plurality of second LEDs in operation. In particular, the controller 18 is configured to provide synchronized electric power pulses to the plurality of first LEDs and the plurality of second LEDs. In this way, the plurality of first LEDs and the plurality of second LEDs may jointly provide for a red-flashing beacon light output of the aircraft beacon light 2.

The controller 18 may be coupled to an on-board power supply network or to an according power adapter (not shown), and it may pass on the received electric power to the plurality of first and second LEDs. The controller 18 may be embodied entirely in hardware or it may comprise a suitable combination of hardware and software for achieving the desired control of the plurality of first and second LEDs.

FIG. 8 additionally shows exemplary light rays 92, 94, 96, 98, as emitted by the second LED 56 depicted on the left hand side of FIG. 8. For enhancing the clarity of illustration, no light rays emitted by the second LED 56 on the right hand side of FIG. 8 are shown. For ease of illustration, the principal light emission directions 16 of the depicted second LEDs 56 are indicated as dashed lines in FIG. 8, with the principal light emission directions 16 being oriented orthogonal to the support 4. The plurality of first and second LEDs are directed light sources, with their principal light emission directions extending orthogonal to the support 4.

A first portion of the light, emitted by the second LED 56, enters the lens structure right after exiting the second LED 56, reaches the first total internal reflection surface 82, experiences total internal reflection at the first total internal reflection surface 82, and is reflected laterally outwards. The exemplary light rays 92, which illustrate said first portion of light, hit the first light exit surface 84 in an orthogonal manner and, therefore, pass the first light exit surface 84 without further refraction.

While being reflected laterally outwards, the first portion of light is collimated in a direction parallel to the support 4, i.e. it is collimated within the horizontal plane in the aircraft frame of reference. For achieving said collimation, the first total internal reflection surface 82 has a parabolic shape in cross-section. The first portion of light encompasses the light as output by the plurality of first and second LEDs in an angular range of about 45° between the principal light emission directions 16 and 45° laterally outwards thereof.

A second portion of light enters the lens structure 8 from the second LED 56, reaches the second total internal reflection surface 86, experiences total internal reflection at the second total internal reflection surface 86, and exits the lens structure 8 for a first time at the second light exit surface 88. The second portion of light is illustrated via exemplary light rays 94.

The second total internal reflection surface 86 is also parabolic. However, the parabolic shape is tilted in such a way with respect to the support 4 that the exemplary light rays 94 are not collimated parallel to the support 4, but somewhat angled upwards with respect to the support 4. The exemplary light rays 94 of the second portion of light experience an additional refraction at the second light exit surface 88. The second portion of light, after passing the second light exit surface 88, re-enters the optical structure 8 at the refractive portion 90. The refractive portion 90 refracts the second portion of light to be parallel or close to parallel with respect to the support 4. In this way, the second portion of light is also emitted in or close to the horizontal plane of the aircraft 100 in the aircraft frame of reference. The second portion of light encompasses the light as output by the plurality of first and second LEDs in an angular range of about 30° between the principal light emission directions 16 and 30° laterally inwards thereof.

A third portion of light emitted by the second LED 56, which is illustrated by exemplary light rays 96, enters the lens structure 8 after being emitted by the second LED 56 and propagates right to the first light exit surface 84. There, the third portion of light is refracted into various angular directions. The third portion of light encompasses the light as output by the plurality of first and second LEDs in an angular range of about 45° between 45° laterally outwards of the principal light emission directions 16 and parallel to the support 4.

A fourth portion of light, which is illustrated by exemplary light rays 98, enters the lens structure 8 after being emitted by the second LED 56 and propagates right to the second light exit surface 88 and the refractive portion 90. There, the fourth portion of light experiences refraction into various angular regions. The fourth portion of light encompasses the light as output by the plurality of first and second LEDs in an angular range of about 60° between 30° laterally inwards of the principal light emission directions 16 and parallel to the support 4.

While the angular distributing of light has been described with respect to an exemplary second LED 56, as depicted in FIG. 8, it is understood that an analogous distributing of light takes place for others of the plurality of second LEDs and for the plurality of first LEDs, just in other vertical cross-sections through the aircraft beacon light 2.

With the given lens structure 8, a highly efficient fulfilling of the FAR light intensity requirements for aircraft beacon lights 2, requiring a high light intensity peak in the horizontal plane in the aircraft frame of reference and requiring a decreasing intensity for larger angles with respect to the horizontal plane, as illustrated in FIG. 2, can be achieved.

The total internal reflection at the first and second total internal reflection surfaces 82, 86 may allow for providing the light intensity peak in the horizontal plane in a particularly space-efficient and energy-efficient manner. As compared to other approaches, where complex optical systems, based on metallic reflectors, were used, an FAR-compliant beacon light output may be achieved with a significant reduction in height over the fuselage. In this way, aerodynamic drag can be reduced, and the exposure to damaging particles and larger objects, such as birds, can be reduced.

It is, however, explicitly pointed out that the formation of the beacon light output may also be achieved with other optical structure designs and that exemplary embodiments of the present invention may also employ such other optical structure designs.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed, but that the invention will include all embodiments falling within the scope of the appended claims.

The invention claimed is:

1. An aircraft beacon light, comprising:
   a plurality of first LEDs, wherein the plurality of first LEDs emit aviation red light in accordance with Federal Aviation Regulations section 25.1397 at an operating temperature of 25° C.; and
   a plurality of second LEDs, wherein the plurality of second LEDs are phosphor-converted LEDs of red or reddish orange color;
   wherein the aircraft beacon light is configured to jointly flash the plurality of first LEDs and the plurality of second LEDs for emitting a red beacon light output,
   wherein the plurality of second LEDs do not emit aviation red light in accordance with Federal Aviation Regulations section 25.1397 at an operating temperature of 25° C., wherein the plurality of second LEDs in particular do not emit aviation red light in accordance with SAE AS 8017 at an operating temperature of 25° C.

2. The aircraft beacon light according to claim 1, wherein the red beacon light output is aviation red in accordance with SAE AS 8017 at an operating temperature of 25° C. of the plurality of first LEDs and the plurality of second LEDs.

3. The aircraft beacon light according to claim 2, wherein the red beacon light output is aviation red in accordance with SAE AS 8017 at least over an operating temperature range from 25° ° C. to 150° ° C. of the plurality of first LEDs and the plurality of second LEDs.

4. The aircraft beacon light according to claim 1, wherein the red beacon light output is within 1 SCDM of aviation red in accordance with Federal Aviation Regulations section 25.1397 at least over an operating temperature range from 25° C. to 150° ° C. of the plurality of first LEDs and the plurality of second LEDs.

5. The aircraft beacon light according to claim 1, wherein a light intensity drop and/or a luminous flux drop of the red beacon light output from an operating temperature of 25° C. to an operating temperature of 150° C. of the plurality of first LEDs and the plurality of second LEDs is less than 60%, in particular less than 50%, further in particular less than 40%.

6. The aircraft beacon light according to claim 1, wherein the plurality of first LEDs are aluminium gallium indium phosphide LEDs.

7. An aircraft beacon light, comprising:
a plurality of first LEDs, wherein the plurality of first LEDs emit aviation red light in accordance with Federal Aviation Regulations section 25.1397 at an operating temperature of 25° C.; and
a plurality of second LEDs, wherein the plurality of second LEDs are phosphor-converted LEDs of red or reddish orange color;
wherein the aircraft beacon light is configured to jointly flash the plurality of first LEDs and the plurality of second LEDs for emitting a red beacon light output,
wherein the aircraft beacon light comprises a plurality of mixed LED groups, wherein each mixed LED group in particular comprises between three and five of the plurality of first LEDs and between one and two of the plurality of second LEDs,
wherein each mixed LED group comprises two first LEDs of reddish orange color, two first LEDs of red color, and one second LED of reddish orange color, or wherein each mixed LED group comprises three first LEDs of red color and two second LEDs of reddish orange color.

8. The aircraft beacon light according to claim 1, further comprising:
a support, wherein the plurality of first LEDs and the plurality of second LEDs are arranged on the support;
an optical structure, arranged over the plurality of first LEDs and the plurality of second LEDs for shaping the red beacon light output from light emitted by the plurality of first LEDs and the plurality of second LEDs; and
a light transmissive cover, arranged over the support, the plurality of first LEDs, the plurality of second LEDs, and the optical structure.

9. The aircraft beacon light according to claim 1, wherein the aircraft beacon light is a fuselage-mounted aircraft beacon light.

10. An aircraft, such as an airplane or a rotorcraft, comprising:
the at least one aircraft beacon light according to claim 1;
wherein the at least one aircraft beacon light in particular comprises an upper aircraft beacon light, mounted to an upper portion of a fuselage of the aircraft, and a lower aircraft beacon light, mounted to a lower portion of the fuselage of the aircraft.

11. An aircraft beacon light, comprising:
a plurality of first LEDs, wherein the plurality of first LEDs emit aviation red light in accordance with Federal Aviation Regulations section 25.1397 at an operating temperature of 25° C.; and
a plurality of second LEDs, wherein the plurality of second LEDs are phosphor-converted LEDs of red or reddish orange color;
wherein the aircraft beacon light is configured to jointly flash the plurality of first LEDs and the plurality of second LEDs for emitting a red beacon light output,
wherein the plurality of second LEDs are of red color, having $0.62<x<0.65$ and $0.30<y<0.33$ according to the CIE 1931 color space, or of reddish orange color, having $0.61<x<0.64$ and $0.34<y<0.37$ according to the CIE 1931 color space.

12. The aircraft beacon light according to claim 7, wherein the plurality of mixed LED groups are arranged in an annular configuration, wherein the plurality of mixed LED groups are in particular arranged in a recurring pattern along the annular configuration.

* * * * *